(12) United States Patent
Yasui et al.

(10) Patent No.: US 7,042,007 B2
(45) Date of Patent: May 9, 2006

(54) SEMICONDUCTOR DEVICE AND METHOD FOR EVALUATING CHARACTERISTICS OF THE SAME

(75) Inventors: Takatoshi Yasui, Osaka (JP); Atsuhiro Kajiya, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 15 days.

(21) Appl. No.: 10/824,426

(22) Filed: Apr. 15, 2004

(65) Prior Publication Data

US 2004/0212016 A1     Oct. 28, 2004

(30) Foreign Application Priority Data

Apr. 24, 2003  (JP)  .............................. 2003-120078

(51) Int. Cl.
*H01L 23/58*    (2006.01)
(52) U.S. Cl. ........................ 257/48; 324/759; 324/769; 257/919
(58) Field of Classification Search .................. 257/48, 257/919; 324/755, 759, 763, 769
See application file for complete search history.

(56) References Cited

U.S. PATENT DOCUMENTS 6,232,619 B1*  5/2001  Chen et al. .................... 257/48
6,362,641 B1    3/2002  Shida

FOREIGN PATENT DOCUMENTS

JP    P2000-214228    8/2000
JP    2002-313866 A   10/2002

* cited by examiner

*Primary Examiner*—Sara Crane
(74) *Attorney, Agent, or Firm*—McDermott Will & Emery LLP

(57) ABSTRACT

A single evaluation portion is formed by disposing a plurality of MIS transistors used for evaluation having substantially the same structure as that of an actually used MIS transistor. In the evaluation portion, the respective source regions, drain regions, and gate electrodes of the MIS transistors used for evaluation are electrically connected in common to a source pad, a drain pad, and a gate pad, respectively. If the effective gate width of the single evaluation portion exceeds a given value, variations in characteristics evaluated by the evaluation portion approach variations in the characteristics of the entire semiconductor device. The accuracy of evaluating the characteristics of the semiconductor device can thus be improved by using the evaluation portion.

13 Claims, 11 Drawing Sheets

FIG. 8A

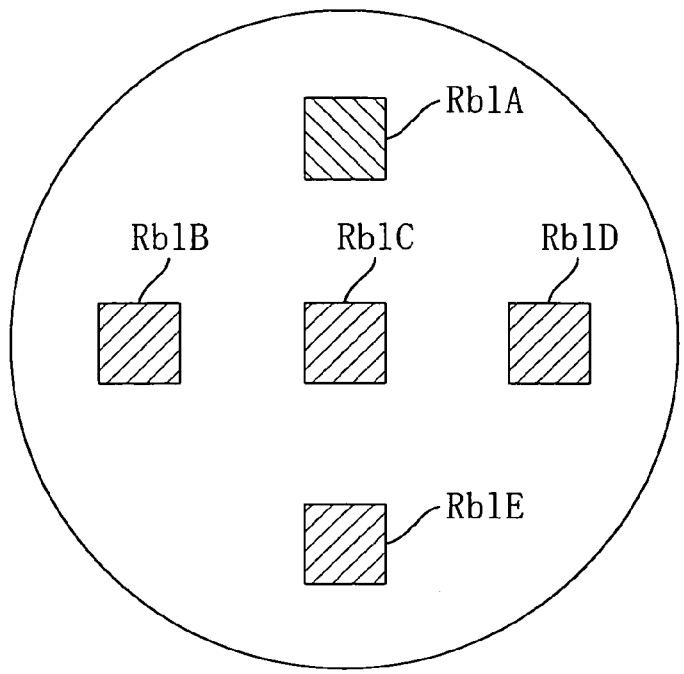

FIG. 8B

For each block, characteristics of single MIS transistors used for evaluation are evaluated, and results are stored in memory.

↓

For each block, average value of the values of the characteristics of the MIS transistors used for evaluation is calculated, and result is stored in memory.

↓

Average value and variance in wafer are calculated from the average values of the characteristics of the respective blocks.

SEMICONDUCTOR DEVICE AND METHOD FOR EVALUATING CHARACTERISTICS OF THE SAME

BACKGROUND OF THE INVENTION

The present invention relates to semiconductor devices in which characteristic evaluation transistors are provided in addition to an actually used transistor, and methods for evaluating characteristics of the semiconductor devices.

Conventionally, devices for checking characteristics, capable of measuring contact resistance, the threshold voltage and I–V characteristics of transistors, and other characteristics, have been provided in semiconductor devices, so that, e.g., characteristics that are out of the ordinary due for example to fluctuations in fabrication qualities and to processing difficulties can be easily checked without performing a probe testing of the product (see for example Japanese Laid-Open Publication (abstract) No. 2000-214228.)

FIGS. 11A through 11C respectively illustrate a circuit diagram, plan view, and cross sectional view of an evaluation portion of a prior art characteristic evaluation transistor.

As shown in FIGS. 11A and 11B, the evaluation portion includes a MIS transistor 101, a source pad 102, a drain pad 103, and a gate pad 104. The MIS transistor 101 is a characteristic evaluation transistor. The source pad 102 is connected to a source region 105 of the MIS transistor 101. The drain pad 103 is connected to a drain region 106 of the MIS transistor 101. The gate pad 104 is connected to a gate electrode 107 of the MIS transistor.

As shown in FIG. 11C, a trench isolation (STI) 110 and the source and drain regions 105 and 106 are defined in a semiconductor substrate 100, which is a Si substrate. The trench isolation 110 defines an active region. The source and drain regions 105 and 106 are both doped with impurities. The MIS transistor further includes a gate insulating film 108 formed on the active region, the gate electrode 107 formed on the gate insulating film 108, and a sidewall 109 formed on the lateral faces of the gate electrode 107. Formed on the semiconductor substrate 100 are an interlayer dielectric film 111 and plugs 112. The interlayer dielectric film 111 covers the gate electrode 107, the sidewall 109 and other portions. The plugs 112 go through the interlayer dielectric film 111 to reach the source and drain regions 105 and 106. The source pad 102, the drain pad 103, and the gate pad 104 are formed on the interlayer dielectric film 111 and connected via the plugs 112 to the source region 105, the drain region 106, and the gate electrode 107, respectively.

As semiconductor devices have been downsized, both the gate length and gate width of MIS transistors in the semiconductor devices have been also reduced. Consequently, random variations in various characteristics of the MIS transistors caused due for example to variations in impurity concentration distribution and in processing accuracy have become more manifest.

On the other hand, considering standby current and gate delay in an entire semiconductor integrated circuit, an enormous number of—millions of—devices (MIS transistors) involve these properties, so that such random variations are counteracted. As a result, variations (standard deviation) in various kinds of characteristics of the semiconductor integrated circuit are relatively small.

Therefore, when evaluation is performed using a conventional characteristic evaluation portion such as mentioned above, the obtained evaluation results indicate variations greater than actual variations in the characteristics of the semiconductor integrated circuit. In other words, the obtained results do not typify the distribution of the characteristics of the semiconductor integrated circuit proper, as a result of which manufacturing conditions might be controlled too strictly.

SUMMARY OF THE INVENTION

It is therefore an object of the present invention to provide an evaluation portion for obtaining variations in characteristics which are close to variations in characteristics of an entire semiconductor device, thereby increasing the accuracy of evaluating the semiconductor device, and hence facilitating fabrication control of the semiconductor device.

An inventive semiconductor device includes an actually used MIS transistor, MIS transistors used for evaluation arranged in parallel, a gate common conductive portion electrically connected to respective gate electrodes of the MIS transistors used for evaluation, a source common conductive portion electrically connected to respective source regions of the MIS transistors used for evaluation, and a drain common conductive portion electrically connected to respective drain regions of the MIS transistors used for evaluation.

Then, the gate width of the MIS transistors used for evaluation becomes greater than that of the actually used MIS transistor, such that variations in characteristics of the MIS transistors used for evaluation are reduced to approach variations in characteristics of the actually used semiconductor device.

The source and drain common conductive portions have respective branched head portions, so that an electrical short can be suppressed.

The inventive semiconductor device further includes dummy electrodes which are formed to both sides of the gate electrode of the MIS transistors used for evaluation, as a result of which the dimensional accuracy of the gate electrode is increased, thereby improving evaluation accuracy. For example, variations in evaluated characteristics are reduced.

If dummy active regions are provided alongside active regions in which the MIS transistors used for evaluation are disposed, stress applied from the isolation region to the active regions is uniformalized in the respective active regions. This results in a decrease in variations in evaluated characteristics, thereby improving evaluation accuracy.

The MIS transistors used for evaluation preferably have substantially the same structure as that of the actually used MIS transistor.

It is preferable that in accordance with the types of actually used MIS transistors, the MIS transistors used for evaluation be provided for those respective types.

An inventive method for evaluating characteristics of a semiconductor device includes the steps of: dividing a wafer into a plurality of blocks; evaluating characteristics of MIS transistors used for evaluation for each block; and calculating, for each block, an average value of the characteristics of the MIS transistors used for evaluation.

Variations in the average values obtained in this manner are close to values obtained as variations in characteristics of MIS transistors when the actual semiconductor device is used. Therefore, evaluation accuracy can be increased.

In this case, it is also preferable that the MIS transistors used for evaluation be arranged in parallel, and that the semiconductor device include a gate common conductive portion electrically connected to respective gate electrodes of the MIS transistors used for evaluation, a source common conductive portion electrically connected to respective source regions of the MIS transistors used for evaluation, and a drain common conductive portion electrically connected to respective drain regions of the MIS transistors used for evaluation.

The MIS transistors used for evaluation may be disposed in scribe areas of the wafer.

BRIEF DESCRIPTION OF THE DRAWINGS

FIG. 1A is a plan view illustrating an evaluation portion in a semiconductor device in accordance with a first embodiment, while

FIG. 4A is a plan view illustrating an evaluation portion in a semiconductor device in accordance with a second embodiment, while

FIG. 5A is a plan view illustrating an evaluation portion in a semiconductor device in accordance with a third embodiment, while

FIG. 6A is a plan view illustrating an evaluation portion in a semiconductor device in accordance with a fourth embodiment, while

FIG. 7A is a plan view illustrating an evaluation portion in a semiconductor device in accordance with a fifth embodiment, while

FIG. 8A is a plan view of a semiconductor device in accordance with a sixth embodiment, and FIG. 8B is a flow chart indicating process steps for evaluating characteristics.

Figure 1A:
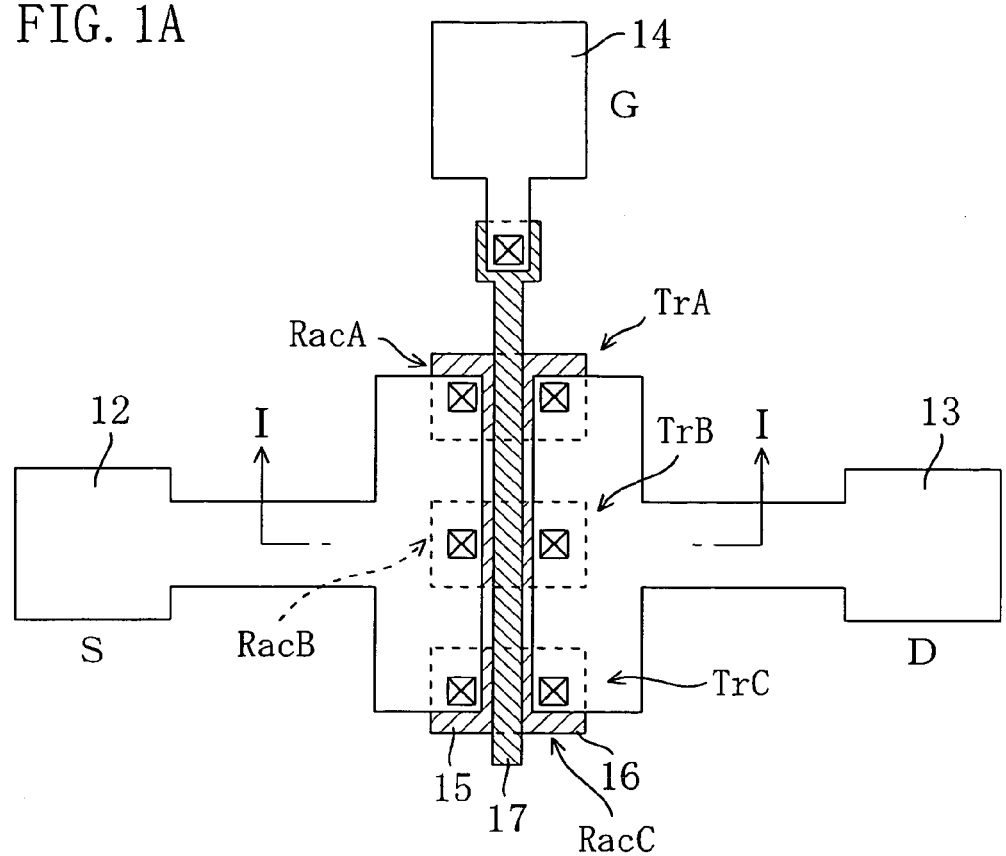
Figure 1B:
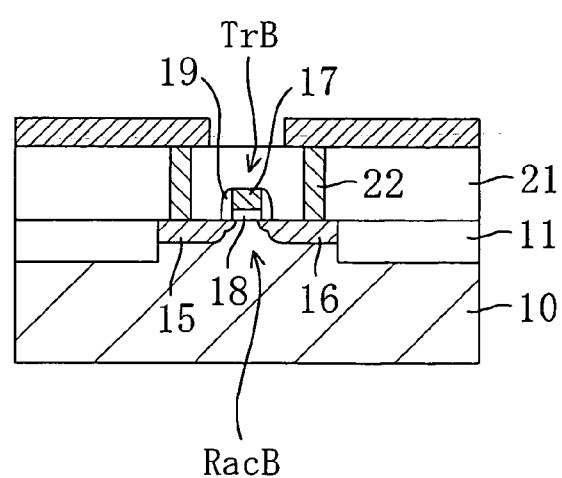
FIG. 1B is a cross sectional view of a MIS transistor used for evaluation in the evaluation portion, taken along a line I—I.

DESCRIPTION OF THE PREFERRED EMBODIMENTS (First Embodiment)
Structure of an Evaluation Potion FIG. 1A is a plan view illustrating an evaluation portion in a semiconductor device in accordance with a first embodiment, while FIG. 1B is a cross sectional view of a MIS transistor used for evaluation in the evaluation portion, taken along a line I—I.

As shown in FIGS. 1A and 1B, the evaluation portion is formed by disposing MIS transistors used for evaluation TrA, TrB, and TrC serving as characteristic evaluation transistor, in three active regions RacA, RacB, and RacC surrounded by a trench isolation 11. A gate electrode 17 is provided for common use by those three MIS transistors used for evaluation TrA through TrC. The evaluation portion includes a source pad 12 (a source common conductive portion), a drain pad 13 (a drain common conductive portion), and a gate pad 14 (a gate common conductive portion). Respective source regions 15 in the three MIS transistors used for evaluation TrA through TrC are electrically connected in common to the source pad 12. Respective drain regions 16 in the three MIS transistors used for evaluation TrA through TrC are electrically connected in common to the drain pad 13. The gate pad 14 is electrically connected to the gate electrode 17 used in common by the three MIS transistors used for evaluation TrA through TrC.

The MIS transistors used for evaluation TrA through TrC have substantially the same structure as that of an actually used MIS transistor. FIG. 1B illustrates a cross sectional structure of the MIS transistor used for evaluation TrB. As shown in FIG. 1B, the trench isolation (STI) 11 that surrounds the active region RacB is formed in a semiconductor substrate 10, which is a Si substrate. In the active region RacB, the source and drain regions 15 and 16, which are both impurity-doped regions and which include extended doped regions (or LDD regions) and heavily doped regions, are formed. The MIS transistor used for evaluation TrB includes a gate insulating film 18 formed on the active region RacB, the gate electrode 17 formed on the gate insulating film 18, and a sidewall 19 formed on the lateral faces of the gate electrode 17. Formed on the semiconductor substrate 10 are an interlayer dielectric film 21 and plugs 22. The interlayer dielectric film 21 covers the gate electrode 17, the sidewall 19 and other portions. The plugs 22 go through the interlayer dielectric film 21 to reach the source and drain regions 15 and 16. The source pad 12, the drain pad 13, and the gate pad 14 are formed on the interlayer dielectric film 21 and electrically connected via the plugs 22 to the source region 15, the drain region 16, and the gate electrode 17, respectively.

In this embodiment, the MIS transistors used for evaluation TrA through TrC are designed so that the gate length, the gate width, the area of the active regions, and impurity concentration in the source and drain regions are substantially the same as those of the actually used logic MIS transistor. In particular the gate width is 1.2 μm, and the gate length is 0.12 μm. As to the area of the active regions, the size in the gate width direction is 1.2 μm, and the size in the gate length direction is 0.86 μm. The source and drain regions have an impurity concentration of $1 \times 10^{17}$ to $1 \times 10^{20} \cdot cm^{-3}$ in the extended doped regions, while having an impurity concentration of $1 \times 10^{20}$ to $3 \times 10^{20} \cdot cm^{-3}$ in the heavily doped regions. Since the actually used MIS transistor can be an n-channel MIS transistor or a p-channel MIS transistor, three are two types of evaluation portions: one such evaluation portion includes three n-channel MIS transistors arranged in parallel, while the other type includes three p-channel MIS transistors arranged in parallel.

As described above, this embodiment is characterized in that the single evaluation portion is formed by disposing the plurality of MIS transistors used for evaluation having substantially the same structure as that of the actually used MIS transistor, and in that the source regions 15, drain regions 16, and gate electrode 17 of the MIS transistors used for evaluation TrA through TrC are electrically connected in common to the source pad 12, the drain pad 13, and the gate pad 14, respectively.

In this embodiment and in the embodiments which will be described later, what is meant by the phrase "the MIS transistors used for evaluation have substantially the same structure as that of the actually used transistor" is that their gate electrodes, gate insulating films, source and drain regions, and other configurations are substantially the same. Factors that define the structure of a gate electrode include the materials of, e.g., a polysilicon structure, of a polycide structure, and of a polymetal structure, sizes (gate length and gate width), and the kind and concentration of impurity in the polysilicon. The structure of a gate insulating film may be defined by the thickness and material thereof. The structure of source and drain regions may be determined by the presence/absence of an LDD region and of an extended region, and by the concentration of impurity therein. Furthermore, the phrase "substantially the same" means that semiconductor devices do not have any difference in their characteristics which is clearly detectable when those semiconductor devices are evaluated.

Evaluation Method Using an Evaluation Portion

Figure 2A:
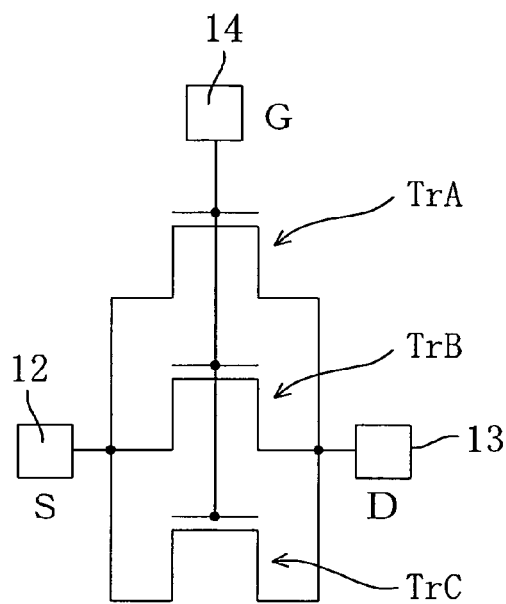
FIGS. 2A and 2B are respectively a circuit diagram of an evaluation portion, and a flow chart indicating evaluation process steps.
Figure 2B:
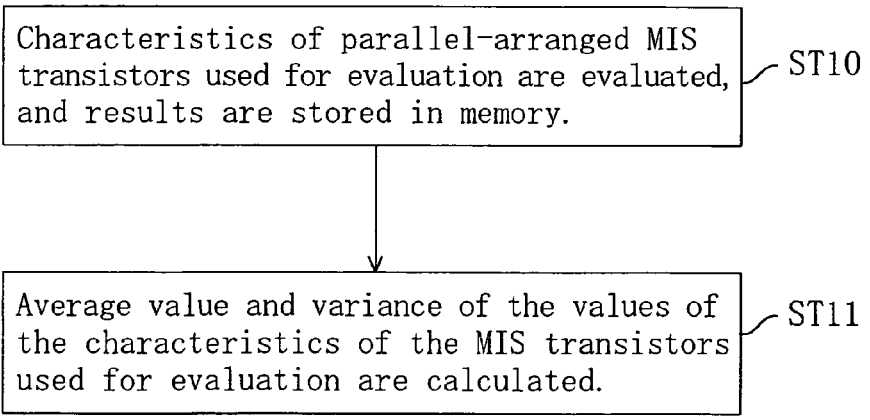

FIGS. 2A and 2B are respectively a circuit diagram of an evaluation portion, and a flow chart indicating evaluation process steps.

As shown in FIG. 2A, an evaluation portion including a plurality of (three in this embodiment) MIS transistors used for evaluation TrA through TrC whose effective gate width is 3 μm or greater is provided. A source pad 12 electrically connected to the respective source regions of the three MIS transistors used for evaluation TrA through TrC, a drain pad 13, and a gate pad 14 are formed in the evaluation portion. In other words, the three MIS transistors used for evaluation are arranged in parallel. A terminal, such as a voltage-applying terminal and a current-measuring terminal, is made contact with the source pad 12, the drain pad 13, and the gate pad 14, so that electric characteristics such as I–V characteristics are evaluated.

As shown in FIG. 2B, to evaluate characteristics of the semiconductor device, characteristics of the parallel-arranged MIS transistors used for evaluation are evaluated, and the results are stored in a memory (not shown) in step ST10. Next, in step ST11, the evaluation results obtained in step ST10 are taken out from the memory, and the average value and variance σ of the values of the characteristics of the MIS transistors used for evaluation are calculated and stored in the memory as the value of the characteristics of a single MIS transistor. The average value and variance of the values of the characteristics of the MIS transistors used for evaluation are then used in simulating the characteristics of the semiconductor device, in designing the semiconductor device, and in controlling the fabrication processes of the semiconductor device.

The characteristics of the semiconductor device that can be evaluated by the evaluation portion of this embodiment include variations in off-leak characteristics and in the threshold voltage and on-state current, e.g., of MIS transistors.

Figure 3:
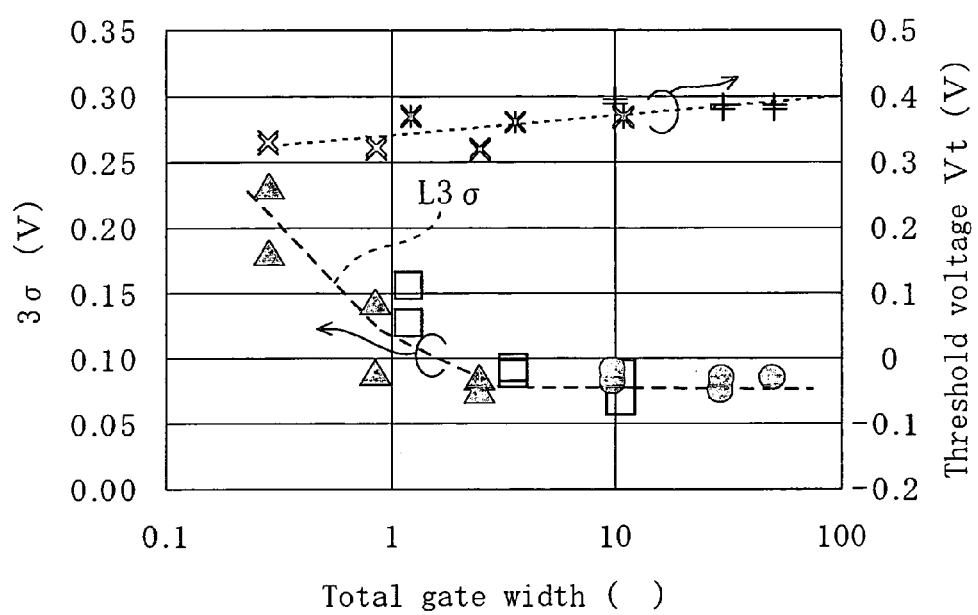
FIG. 3 is a view indicating the threshold voltages Vt of MIS transistors and the variations 3σ thereof with respect to the effective gate width (total gate width) of the MIS transistors used for evaluation.

FIG. 3 is a view indicating the threshold voltage Vt of MIS transistors and the variations 3σ thereof with respect to the effective gate width (total gate width) of MIS transistors used for evaluation. In FIG. 3, the abscissa axis represents the total value of the gate widths of the parallel-arranged MIS transistors used for evaluation. The ordinate axes indicate 3σ, which is three times the standard deviation of the threshold voltage Vt (on the left-hand side), while representing the threshold voltage Vt (on the right-hand side). In FIG. 3, the solid triangles (▲) indicate 3σ of threshold voltages obtained by evaluation portions in which one, three, and nine MIS transistors used for evaluation with a gate width of 0.26μm are arranged, respectively. Open squares (□) indicate 3σ of threshold voltages obtained by evaluation portions in which one, three, and nine MIS transistors used for evaluation with a gate width of 1.2 μm are arranged, respectively. Solid circles (●) indicate 3σ of threshold voltages obtained by evaluation portions in which one, three, and five MIS transistors used for evaluation with a gate width of 10.0 μm are arranged, respectively. Furthermore, marks "X" indicate data on the threshold voltages obtained by the evaluation portions in which the one, three, and nine MIS transistors used for evaluation with a gate width of 0.26 μm are arranged, respectively. Marks "X̶" indicate data on the threshold voltages obtained by the evaluation portions in which the one, three, and nine MIS transistors used for evaluation with a gate width of 1.2 μm are arranged, respectively. Marks "+" indicate data on the threshold voltages obtained by the evaluation portions in which the one, three, and five MIS transistors used for evaluation with a gate width of 10.0 μm are arranged, respectively.

In FIG. 3, a broken line L3σ represents the average value of 3σ of the various samples, and the following can be found from the broken line L3σ. If the total gate width is 3 μm or greater, 3σ exhibits a constant value, indicating the average variations in an actually used MIS transistor. In other words, it was found that considering the semiconductor device as a whole, local variations in the characteristics of the MIS transistors were counteracted, and a value regarding variations in the characteristics of the entire semiconductor device was substantially equal to the value of 3σ obtained when the total gate width is 3 μm or greater in FIG. 3.

If the total gate width is smaller than 3 μm, on the other hand, the value of 3σ indicating variations in the threshold voltage is increased. In particular, when the total gate width is smaller than 1.0 μm, the value of 3σ is nearly twice the value of 3σ obtained when the total gate width is 3 μm. Therefore, as in the prior art semiconductor device, if variations in characteristics of a single actually used MIS transistor are found by using an evaluation portion in which only one MIS transistor used for evaluation is disposed, and in that case if, based on 3σ (variation) of the value of the characteristics, the semiconductor device is designed and the fabrication process is controlled, for example, it would be incorrectly determined that there are variations in the characteristics, which are greater than actual variations in the characteristics of the semiconductor device.

Contrary to this, if characteristics of MIS transistors are evaluated by using an evaluation portion of this embodiment such as shown in FIG. 2, it is possible to accurately perform for example characteristics simulation, design, and fabrication process control based on variations in the characteristics which are substantially equal to variations in commercial semiconductor devices.

(Second Embodiment)

Figure 4A:
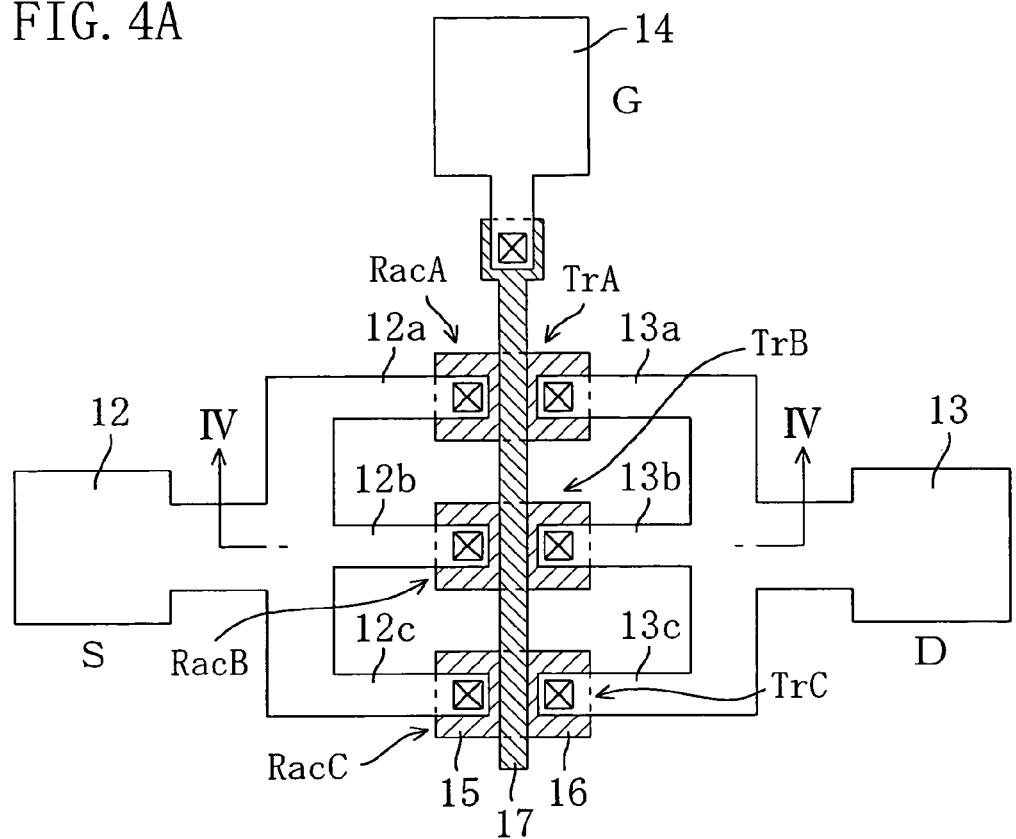
Figure 4B:
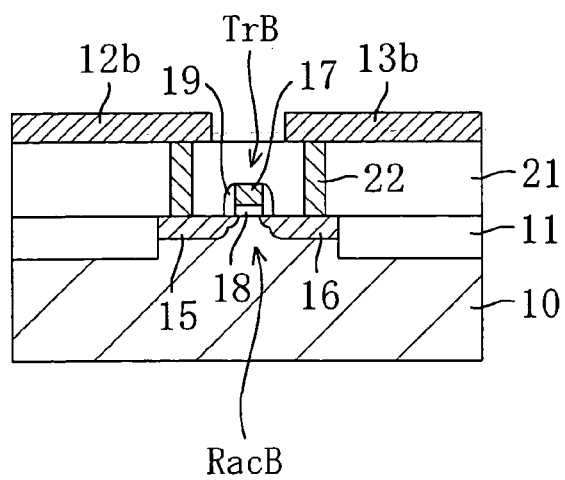
FIG. 4B is a cross sectional view of a MIS transistor used for evaluation in the evaluation portion, taken along a line IV—IV.

FIG. 4A is a plan view illustrating an evaluation portion in a semiconductor device in accordance with a second embodiment, while FIG. 4B is a cross sectional view of a MIS transistor used for evaluation in the evaluation portion, taken along a line IV—IV.

As shown in FIGS. 4A and 4B, in this embodiment, the evaluation portion is also formed by disposing MIS transistors used for evaluation TrA, TrB, and TrC serving as characteristic evaluation transistors, in three active regions RacA, RacB, and RacC surrounded by a trench isolation 11. A gate electrode 17 is provided for common use by those three MIS transistors used for evaluation TrA through TrC. The evaluation portion includes a source pad 12, a drain pad 13, and a gate pad 14. Respective source regions 15 in the three MIS transistors used for evaluation TrA through TrC are electrically connected to the source pad 12. Respective drain regions 16 in the three MIS transistors used for evaluation TrA through TrC are electrically connected to the drain pad 13. The gate pad 14 is electrically connected to the gate electrode 17 used in common by the three MIS transistors used for evaluation TrA through TrC.

This embodiment is different from the first embodiment in that the heads of the source and drain pads 12 and 13 branch into respective three portions 12a through 12c and 13a through 13c that extend to the active regions RacA through RacC.

The cross sectional structure illustrated in FIG. 4B is basically the same as the structure of the single MIS transistor used for evaluation TrB of the first embodiment illustrated in FIG. 1B, so description thereof will be omitted.

In this embodiment, the MIS transistors used for evaluation TrA through TrC are also designed so as to have substantially the same structure as that of an actually used MIS transistor.

As described above, this embodiment is the same as the first embodiment in that the single evaluation portion is formed by disposing the plurality of MIS transistors used for evaluation having substantially the same structure as that of the actually used MIS transistor, and in that the source regions 15, drain regions 16 and gate electrode 17 of the MIS transistors used for evaluation TrA through TrC are electrically connected in common to the source pad 12, the drain pad 13, and the gate pad 14, respectively.

In this embodiment, characteristics of MIS transistors are also evaluated using an evaluation portion such as shown in FIG. 2.

Therefore, in this embodiment as in the first embodiment, it is possible to accurately perform for example characteristics simulation, design, and fabrication process control based on variations in characteristics which are substantially equal to variations in commercial semiconductor devices.

In particular, in this embodiment, the heads of the source and drain pads 12 and 13 branch into the respective three portions 12a through 12c and 13a through 13c that extend to the active regions RacA through RacC. This reduces the area of the portions of the source and drain pads 12 and 13 that oppose each other in close vicinity. Therefore, as compared with the first embodiment, the occurrence of an electrical short between the source pad 12 and the drain pad 13 can be suppressed effectively.

(Third Embodiment)

Figure 5A:
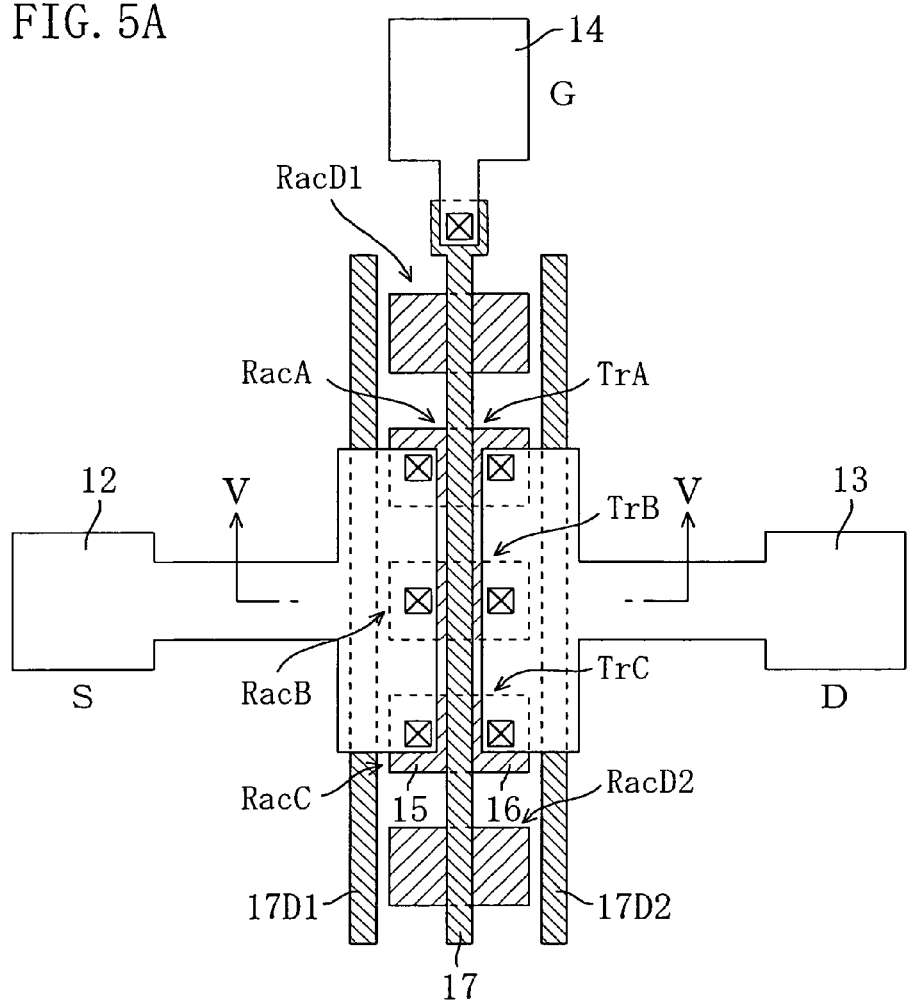
Figure 5B:
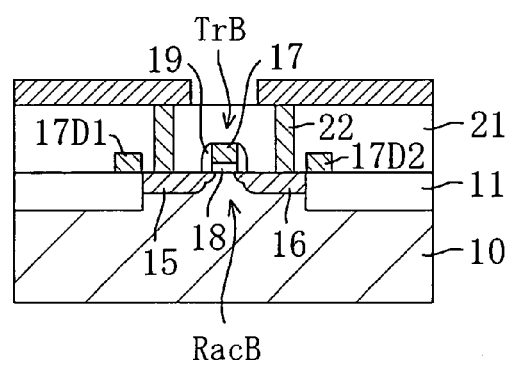
FIG. 5B is a cross sectional view of a MIS transistor used for evaluation in the evaluation portion, taken along a line V—V.

FIG. 5A is a plan view illustrating an evaluation portion in a semiconductor device in accordance with a third embodiment, while FIG. 5B is a cross sectional view of a MIS transistor used for evaluation in the evaluation portion, taken along a line V—V.

As shown in FIGS. 5A and 5B, in this embodiment, the evaluation portion is also formed by disposing MIS transistors used for evaluation TrA, TrB, and TrC serving as characteristic evaluation transistors, in three active regions RacA, RacB, and RacC surrounded by a trench isolation 11. A gate electrode 17 is provided for common use by those three MIS transistors used for evaluation TrA through TrC. The evaluation portion includes a source pad 12, a drain pad 13, and a gate pad 14. Respective source regions 15 in the three MIS transistors used for evaluation TrA through TrC are electrically connected to the source pad 12. Respective drain regions 16 in the three MIS transistors used for evaluation TrA through TrC are electrically connected to the drain pad 13. The gate pad 14 is electrically connected to the gate electrode 17 used in common by the three MIS transistors used for evaluation TrA through TrC.

In this embodiment, two dummy active regions RacD1 and RacD2, in which no MIS transistors are disposed, are provided in such a manner that the active regions RacA through RacC, in which the MIS transistors used for evaluation TrA through TrC are disposed, are sandwiched between those dummy active regions RacD1 and RacD2. Furthermore, two dummy gates 17D1 and 17D2, arranged substantially in parallel with the gate electrode 17, are provided, with the gate electrode 17 being interposed between the dummy gates 17D1 and 17D2. In those two respects, this embodiment is different from the first embodiment.

The cross sectional structure illustrated in FIG. 5B is the same as the structure of the single MIS transistor used for evaluation TrB of the first embodiment illustrated in FIG. 1B, except that the two dummy gates 17D1 and 17D2 are provided with the gate electrode 17 being sandwiched therebetween, so description of the portions common to the first embodiment will be omitted.

In this embodiment, the MIS transistors used for evaluation TrA through TrC are also designed so as to have substantially the same structure as that of an actually used logic MIS transistor.

This embodiment is the same as the first embodiment in that the single evaluation portion is formed by disposing the plurality of MIS transistors used for evaluation having substantially the same structure as that of the actually used MIS transistor, and in that the source regions 15, drain regions 16, and gate electrode 17 of the MIS transistors used for evaluation TrA through TrC are electrically connected in common to the source pad 12, the drain pad 13, and the gate pad 14, respectively.

In this embodiment, characteristics of MIS transistors are also evaluated using an evaluation portion such as shown in FIG. 2.

Therefore, in this embodiment as in the first embodiment, it is possible to accurately perform for example characteristics simulation, design, and fabrication process control based on variations in characteristics which are substantially equal to variations in commercial semiconductor devices.

In particular, in this embodiment, the two dummy active regions RacD1 and RacD2 are provided in such a manner that the active regions RacA through RacC, in which the MIS transistors used for evaluation TrA through TrC are formed, are sandwiched between those dummy active regions RacD1 and RacD2. Therefore, stress applied to the active regions RacA through RacC from the trench isolation that surrounds the active regions RacA through RacC is almost uniformalized. As a result, variations in characteristics of the MIS transistors used for evaluation TrA through TrC are decreased, such that the characteristics of the actually used MIS transistor can be evaluated more accurately.

In addition, in this embodiment, the two dummy gates 17D1 and 17D2 are provided in such a manner that the common gate electrode 17 of the MIS transistors used for evaluation TrA through TrC is interposed between the dummy gates 17D1 and 17D2. Therefore, those three gates 17, 17D1, and 17D2 form a so-called line-and-space pattern. Accordingly, the dimensional accuracy of the gate electrode 17 is increased, which also leads to a decrease in the variations in the characteristics of the MIS transistors used for evaluation TrA through TrC. As a result, the characteristics of the MIS transistors used for evaluation TrA through TrC can be estimated more accurately.

(Fourth Embodiment)

Figure 6A:
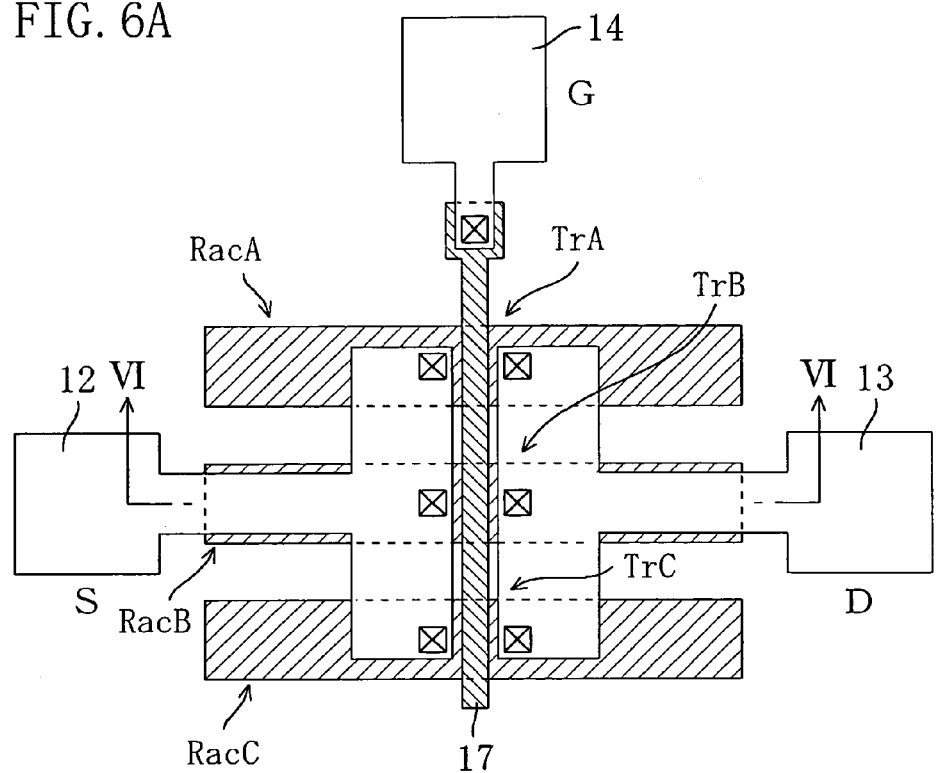
Figure 6B:
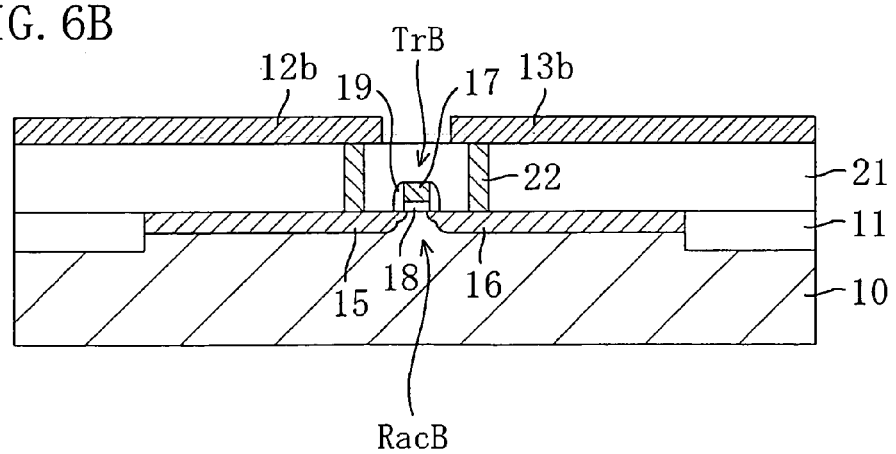
FIG. 6B is a cross sectional view of a MIS transistor used for evaluation in the evaluation portion, taken along a line VI—VI.

FIG. 6A is a plan view illustrating an evaluation portion in a semiconductor device in accordance with a fourth embodiment, while FIG. 6B is a cross sectional view of a MIS transistor used for evaluation in the evaluation portion, taken along a line VI—VI.

As shown in FIGS. 6A and 6B, in this embodiment, the evaluation portion is also formed by disposing MIS transistors used for evaluation TrA, TrB, and TrC serving as characteristic evaluation transistors, in three active regions RacA, RacB, and RacC surrounded by a trench isolation 11. A gate electrode 17 is provided for common use by those three MIS transistors used for evaluation TrA through TrC. The evaluation portion includes a source pad 12 and a drain pad 13. Respective source regions 15 in the three MIS transistors used for evaluation TrA through TrC are electrically connected to the source pad 12. Respective drain regions 16 in the three MIS transistors used for evaluation TrA through TrC are electrically connected to the drain pad 13.

This embodiment differs from the first embodiment in that the dimension of the active regions RacA through RacC in the gate length direction is larger than the gate-length direction dimension of an active region in which an actually used MIS transistor is disposed. For example, the gate-length direction dimension of the active region for the actually used MIS transistor is 0.86 μm, while the gate-length direction dimension of the active regions RacA through RacC, in which the MIS transistors used for evaluation TrA through TrC are disposed, is 10 μm (not less than 2 μm). However, the dimension of the active regions RacA through RacC in the gate width direction is the same as the gate-width dimension of the MIS transistors used for evaluation TrA through TrC, and is thus substantially the same as the gate-width direction dimension of the active region in which the actually used MIS transistor is disposed.

The cross sectional structure illustrated in FIG. 6B is the same as the structure of the single MIS transistor used for evaluation TrB of the first embodiment illustrated in FIG. 1B, except that the dimension of the active region RacB in the gate length direction is greater, so description of the portions common to the first embodiment will be omitted.

In this embodiment, the MIS transistors used for evaluation TrA through TrC are also designed so as to have substantially the same structure as that of the actually used MIS transistor.

As described above, this embodiment is the same as the first embodiment in that the single evaluation portion is formed by disposing the plurality of MIS transistors used for evaluation having substantially the same structure as that of the actually used MIS transistor except that the gate-length direction dimension of their source and drain regions is different, and in that the source regions 15, drain regions 16 and gate electrode 17 of the MIS transistors used for evaluation TrA through TrC are electrically connected in common to the source pad 12, the drain pad 13, and the gate pad 14, respectively.

In this embodiment, characteristics of MIS transistors are also evaluated using an evaluation portion such as shown in FIG. 2.

Therefore, in this embodiment as in the first embodiment, it is possible to accurately perform for example characteristics simulation, design, and fabrication process control based on variations in characteristics which are substantially equal to variations in commercial semiconductor devices.

In particular, in this embodiment, the gate-length direction dimension of the active regions RacA through RacC, in which the MIS transistors used for evaluation TrA through TrC are disposed, is larger than the gate-length direction dimension of the active region in which the actually used MIS transistor is disposed. This decreases stress applied to the active regions RacA through RacC from the trench isolation that surrounds the active regions RacA through RacC. Therefore, variations in characteristics of the MIS transistors used for evaluation TrA through TrC are reduced. As a result, characteristics of the actually used MIS transistor can be estimated more accurately. Moreover, a mask-misalignment caused increase in contact resistance between contact members and the source and drain regions can also be avoided, allowing an increase in the estimation accuracy.

(Fifth Embodiment)

Figure 7A:
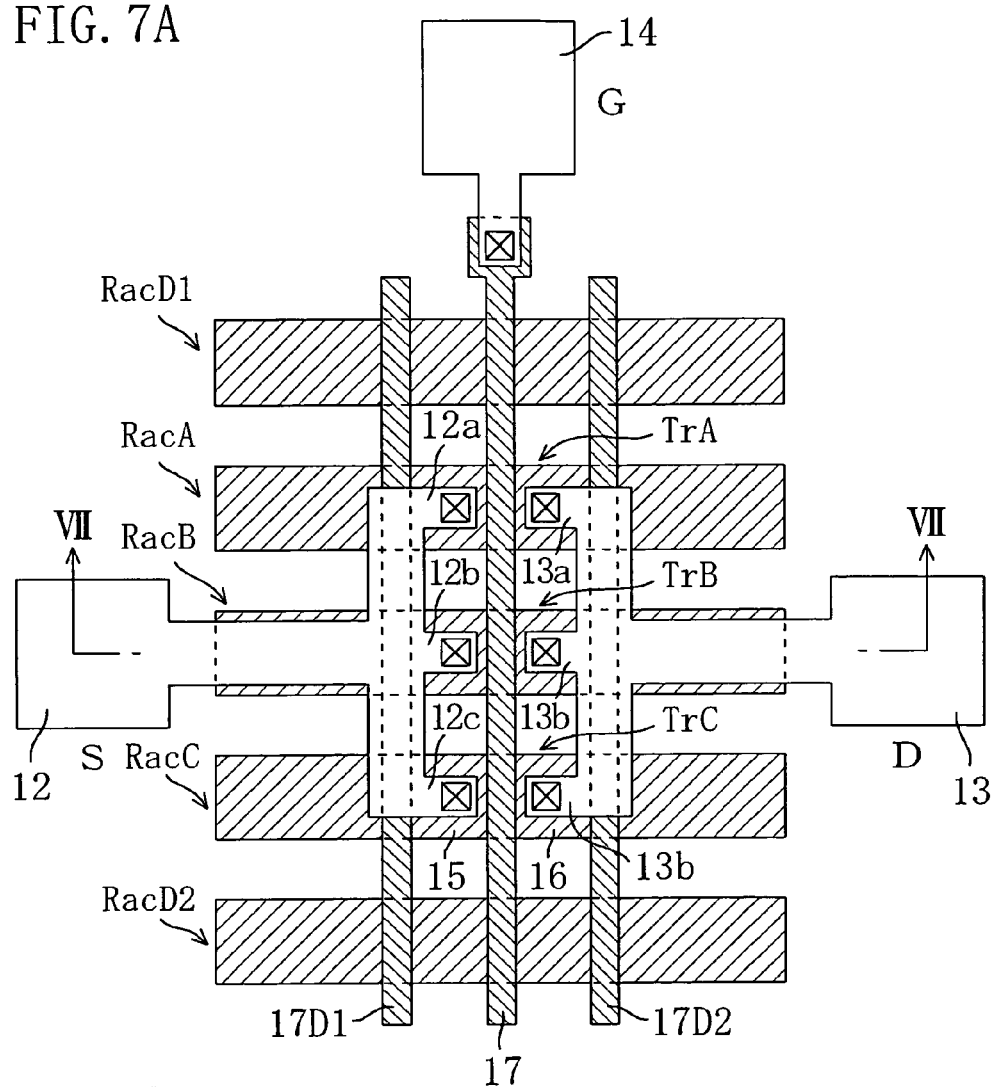
Figure 7B:
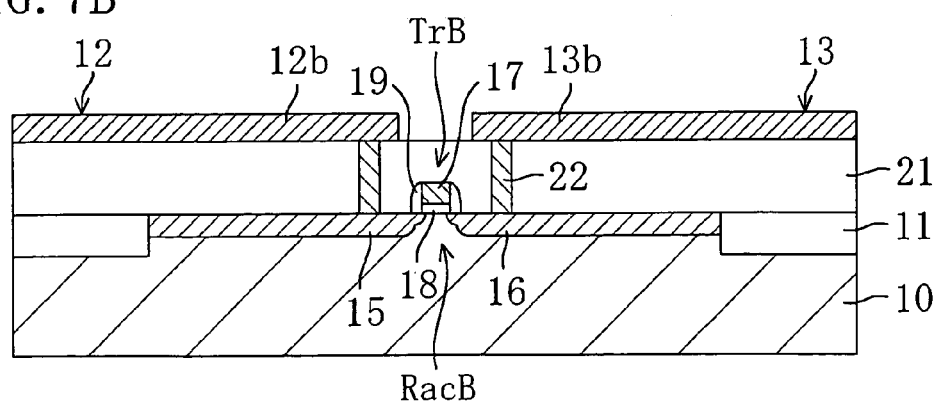
FIG. 7B is a cross sectional view of a MIS transistor used for evaluation in the evaluation portion, taken along a line VII—VII.

FIG. 7A is a plan view illustrating an evaluation portion in a semiconductor device in accordance with a fifth embodiment, while FIG. 7B is a cross sectional view of a MIS transistor used for evaluation in the evaluation portion, taken along a line VII—VII.

As shown in FIGS. 7A and 7B, in this embodiment, the evaluation portion is also formed by disposing MIS transistors used for evaluation TrA, TrB, and TrC serving as characteristic evaluation transistors, in three active regions RacA, RacB, and RacC surrounded by a trench isolation 11. A gate electrode 17 is provided for common use by those three MIS transistors used for evaluation TrA through TrC. The evaluation portion includes a source pad 12, a drain pad 13, and a gate pad 14. Respective source regions 15 in the three MIS transistors used for evaluation TrA through TrC are electrically connected to the source pad 12. Respective drain regions 16 in the three MIS transistors used for evaluation TrA through TrC are electrically connected to the drain pad 13. The gate pad 14 is electrically connected to the gate electrode 17 used in common by the three MIS transistors used for evaluation TrA through TrC.

This embodiment is characterized by having all of the characteristics of the first through third embodiments.

First, the heads of the source and drain pads 12 and 13 branch into respective three portions 12a through 12c and 13a through 13c that extend to the active regions RacA through RacC. Two dummy active regions RacD1 and RacD2, in which no MIS transistors are disposed, are provided in such a manner that the active regions RacA through RacC, in which the MIS transistors used for evaluation TrA through TrC are disposed, are sandwiched between those dummy active regions RacD1 and RacD2. Furthermore, two dummy gates 17D1 and 17D2, arranged substantially in parallel with the gate electrode 17, are formed with the gate electrode 17 being interposed between the dummy gates 17D1 and 17D2. Moreover, the dimension of the active regions RacA through RacC in the gate length direction is greater than the gate-length direction dimension of an active region in which an actually used MIS transistor is disposed. For example, the gate-length direction dimension of the active region for the actually used MIS transistor is 0.86 μm, while the gate-length direction dimension of the active regions RacA through RacC, in which the MIS transistors used for evaluation TrA through TrC are disposed, is 10 μm (not less than 2 μm). However, the gate-width direction dimension of the active regions RacA through RacC is the same as the gate-width dimension of the MIS transistors used for evaluation TrA through TrC, and is thus substantially the same as the gate-width direction dimension of the active region in which the actually used MIS transistor is disposed.

The cross sectional structure illustrated in FIG. 7B is basically the same as the structure of the single MIS transistor used for evaluation TrB of the first embodiment illustrated in FIG. 1B except that the gate-length direction dimension of the active region RacB is greater, so description of the portions common to the first embodiment will be omitted.

In this embodiment, the MIS transistors used for evaluation TrA through TrC are also designed so as to have substantially the same structure as that of the actually used MIS transistor.

As described above, this embodiment is the same as the first embodiment in that the single evaluation portion is formed by disposing the plurality of MIS transistors used for evaluation having substantially the same structure as that of the actually used MIS transistor except that the gate-length direction dimension of their source and drain regions is different, and in that the source regions 15, drain regions 16 and gate electrode 17 of the MIS transistors used for evaluation TrA through TrC are electrically connected in common to the source pad 12, the drain pad 13, and the gate pad 14, respectively.

In this embodiment, characteristics of MIS transistors are also evaluated using an evaluation portion such as shown in FIG. 2.

Therefore, in this embodiment as in the first embodiment, it is possible to accurately perform for example characteristics simulation, design, and fabrication process control based on variations in characteristics which are substantially equal to variations in commercial semiconductor devices.

Furthermore, in this embodiment as in the second embodiment, the heads of the source and drain pads 12 and 13 branch into the respective three portions 12a through 12c and 13a through 13c that extend to the active regions RacA through RacC. This reduces the area of the portions of the source and drain pads 12 and 13 that oppose each other in close vicinity. Therefore, as compared with the first embodiment, the occurrence of an electrical short between the source pad 12 and the drain pad 13 can be suppressed more effectively.

Moreover, in this embodiment as in the fourth embodiment, the gate-length direction dimension of the active regions RacA through RacC, in which the MIS transistors used for evaluation TrA through TrC are disposed, is greater than the gate-length direction dimension of the active region in which the actually used MIS transistor is disposed. This results in a decrease in stress applied to the active regions RacA through RacC from the trench isolation that surrounds the active regions RacA through RacC. Therefore, variations in characteristics of the MIS transistors used for evaluation TrA through TrC are reduced. As a result, characteristics of the actually used MIS transistor can be estimated more accurately. Moreover, a mask-misalignment-caused increase in contact resistance between contact members and the source and drain regions can also be avoided, allowing an increase in the estimation accuracy.

(Special Remarks on the First Through Fifth Embodiments)

In the first through fifth embodiments, if there are multiple types of actually used MIS transistors, as a general rule, an evaluation portion in which for each type of actually used MIS transistor, a plurality of MIS transistors used for evaluation are disposed is provided. For example, there are two types of channel conductivities, so there are a p-channel MIS transistor and an n-channel MIS transistor. A high-threshold-value MIS transistor and a low-threshold-value MIS transistor have different gate-insulating-film thicknesses. Memory cell transistors differ, e.g., from transistors used in peripheral circuits of a memory in terms of gate length, gate width, the structure and impurity concentration of source and drain regions, and other respects. Therefore, provided is an evaluation portion in which for each of these types of actually used MIS transistors, a plurality of MIS transistors used for evaluation are disposed, and the MIS transistors used for evaluation have the same structures as those of the respective corresponding types of actually used MIS transistors.

However, in a case where based on data regarding one type of MIS transistor, variations in characteristics of other types of MIS transistors can be substantially known, for example, if average variations in characteristics of p-channel transistors can be estimated from average variations in characteristics of n-channel MIS transistors, then, evaluation portions do not have to be necessarily provided for those types of transistors whose variations in the characteristics can be estimated.

In the fourth embodiment (see FIG. 6) and in the fifth embodiment (see FIG. 7), the gate-length direction dimension of the active regions of the MIS transistors used for evaluation is greater than the gate-length direction dimension of the active region of the actually used MIS transistor. However, this difference in the gate-length direction dimension does not change the characteristics of the MIS transistors to such an extent that such a change is detectable. Therefore, in this case, it can be also considered that the MIS transistors used for evaluation and the actually used MIS transistor have substantially the same structure.

In the first through fifth embodiments, as will be described later, the effects can be attained, if the gate width of the MIS transistors used for evaluation that are electrically connected to the common gate pad has a value equal to or greater than a predetermined value.

Furthermore, in the first through fifth embodiments, the MIS transistors do not necessarily need the common gate electrode, and a single gate pad electrically connected to gate electrodes that are formed separately for the respective MIS transistors may be provided.

In particular, in the first and fourth embodiments, the active regions RacA through RacC do not have to be brought together adjacent to each other to form an evaluation portion. If the respective gate electrodes and source and drain regions of MIS transistors used for evaluation disposed in active regions that are located apart from each other are electrically connected to respective common pads, the same effects as those of the first and fourth embodiments can be exhibited.

Moreover, in the first through fifth embodiments, the source pad 12, the drain pad 13, and the gate pad 14 are formed on the interlayer dielectric film 21 located immediately on the semiconductor substrate 10. Nevertheless, pads are formed on the uppermost layer in typical semiconductor devices, because the typical semiconductor devices have a multi-layer interconnect structure-formed by stacking many interlayer dielectric films and many interconnect layers in sequence. In the foregoing embodiments, for easy understanding, only one interlayer dielectric film and plugs therein are provided.

(Sixth Embodiment)

Figure 11A:
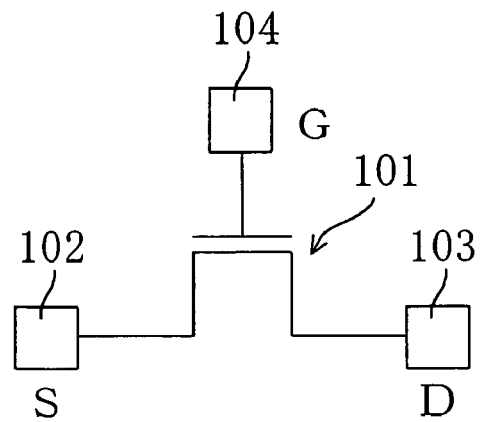
FIGS. 11A through 11C respectively illustrates a circuit diagram, a plan view, and a cross sectional view taken along a line XI—XI, of an evaluation portion of a prior art characteristic evaluation transistor.
Figure 11B:
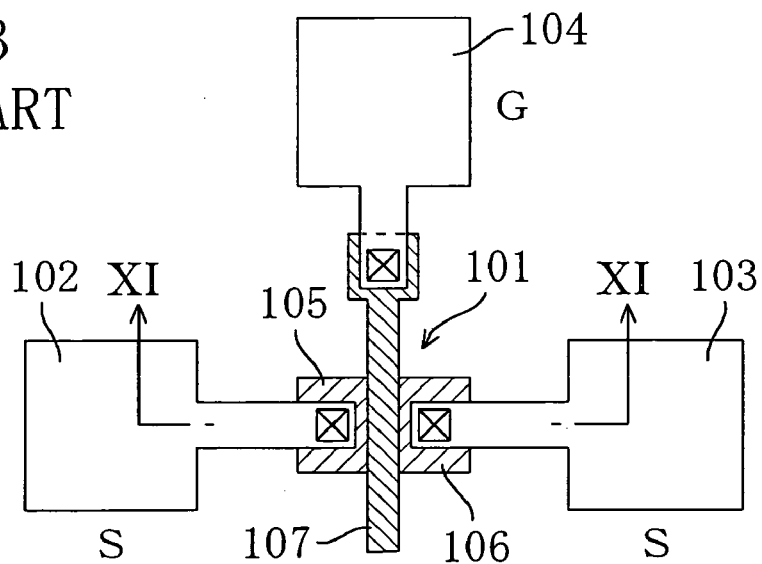
Figure 11C:
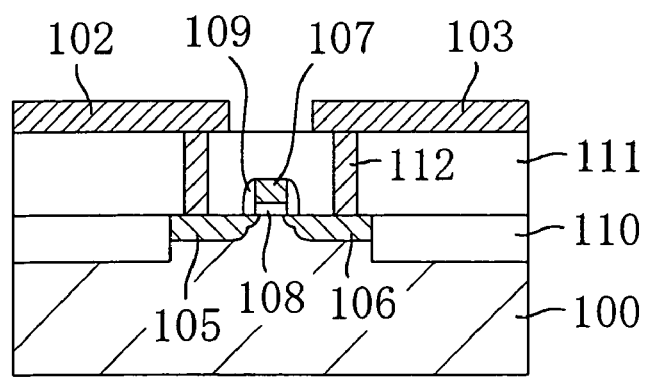

FIG. 8A is a plan view of a semiconductor device in accordance with a sixth embodiment, and FIG. 8B is a flow chart indicating process steps for evaluating characteristics. As shown in FIG. 8A, a plurality of evaluation portions (with the same structure as that of the prior art evaluation portion illustrated in FIG. 11) each including a single MIS transistor used for evaluation are provided in each of blocks Rb1A through Rb1E in a wafer. The blocks Rb1 are designed so as to include a plurality of chips that will be cut as products from the wafer.

As shown in FIG. 8B, in evaluating characteristics of the semiconductor device, characteristics of those single MIS transistors used for evaluation are evaluated for each of the blocks Rb1, and the evaluation results are stored in a memory (not shown) in step ST20. Next, in step ST21, for each of the blocks Rb1, the average value of the characteristics of the MIS transistors used for evaluation is calculated by using the values of the characteristics of the MIS transistors stored in the memory, and the calculation results are stored in the memory (not shown). In other words, for each of the blocks Rb1, the average value of the values of the characteristics of the MIS transistors used for evaluation is calculated by using the evaluation portions in each of which the single MIS transistor used for evaluation is disposed, and the calculated value is stored in the memory as the value of the characteristics of a single MIS transistor.

Then, in step ST22, the average values of the characteristics of the MIS transistors for the respective blocks Rb1 are taken out from the memory, and the average value and variance of the values of the characteristics of the MIS transistors in the wafer are then calculated. Those average value and variance of the values of the characteristics of the MIS transistors are used for example in simulating the characteristics of the semiconductor device, in designing the semiconductor device, and in controlling the fabrication processes of the semiconductor device.

The characteristics of the semiconductor device that can be evaluated by the evaluation portions of this embodiment include variations in off-leak characteristics and in the threshold voltage and on-state current, e.g., of MIS transistors.

By the semiconductor-device characteristic evaluation method of this embodiment, local variations in characteristics of the MIS transistors are counteracted as in the first embodiment, such that it is possible to accurately perform for example characteristics simulation, design, and fabrication process control based on variations in the characteristics which are substantially equal to variations in commercial semiconductor devices.

In the sixth embodiment, evaluation can be performed before the wafer is divided into individual chips or after the wafer has been cut into the individual chips. Even after the wafer has been cut into the individual chips, if the blocks in which the MIS transistors used for evaluation were disposed can be specified, the above mentioned effects can be exhibited.

(Seventh Embodiment)

Figure 9:
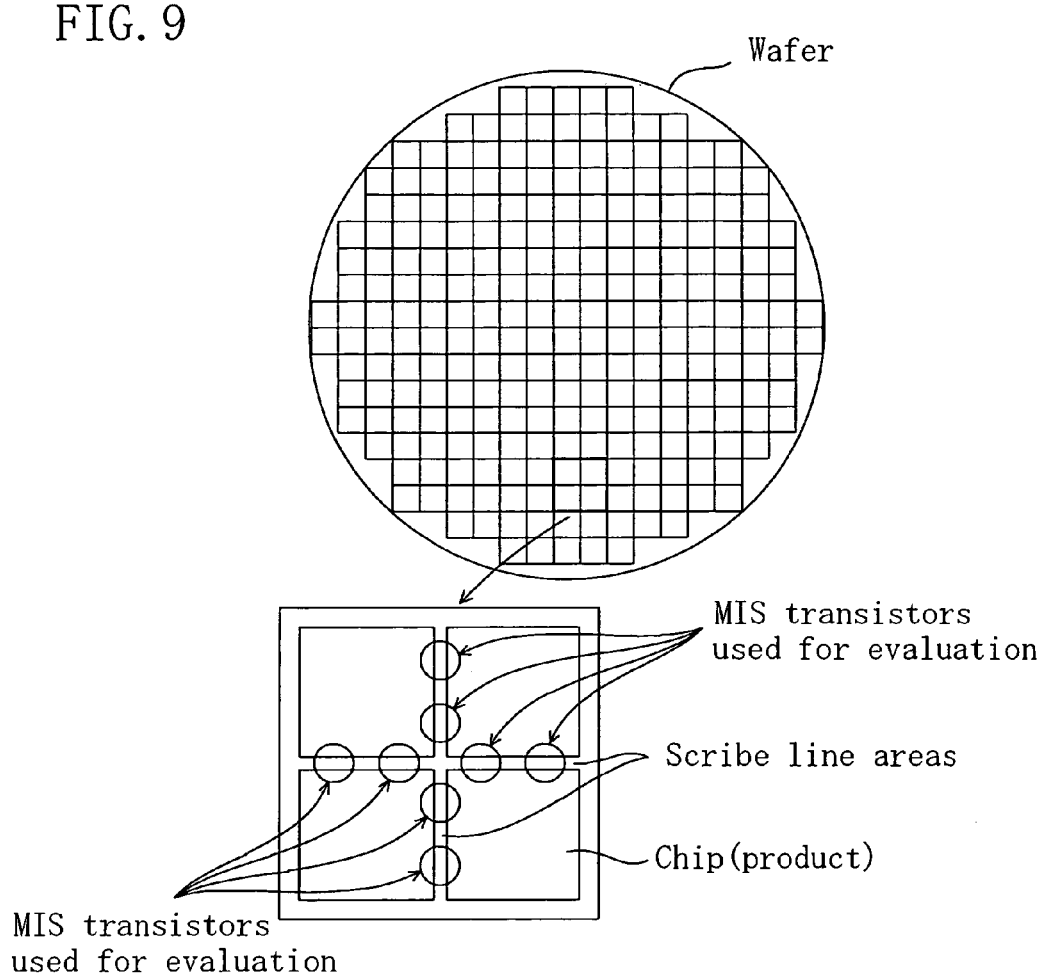
FIG. 9 is a plan view of a semiconductor device in accordance with a seventh embodiment.

FIG. 9 is a plan view of a semiconductor device in accordance with a seventh embodiment. As shown in FIG. 9, a plurality of evaluation portions (with the same structure as that of the prior art evaluation portion illustrated in FIG. 11), in each of which a single MIS transistor used for evaluation is disposed, are provided on scribe lines (scribe areas) that are used to divide a wafer into a plurality of chips (products.) The evaluation portions are provided so as to be distributed substantially evenly across the entire wafer.

To evaluate characteristics of the semiconductor device, the same process steps as those shown in FIG. 8B are carried out. More specifically, the wafer is grouped into several (for example, five as shown in FIG. 8A) areas. Then, for each area, characteristics of the single MIS transistors used for evaluation included are evaluated, and the evaluation results are stored in a memory (not shown). Next, for each area, the average value of the characteristics of the MIS transistors used for evaluation is calculated by using the values of the characteristics of the MIS transistors stored in the memory, and the calculation results are stored in the memory (not shown). In other words, for each of the grouped areas, the average value of the values of the characteristics of the MIS transistors used for evaluation included is calculated by using the evaluation portions in each of which the single MIS transistor used for evaluation is disposed, and the calculated value is stored in the memory as the value of the characteristics of a single MIS transistor.

Then, the average values of the characteristics of the MIS transistors for the respective areas are taken out from the memory, and the average value and variance of the values of the characteristics of the MIS transistors in the wafer are then calculated. Those average value and variance of the values of the characteristics of the MIS transistors are used for example in simulating the characteristics of the semiconductor device, in designing the semiconductor device, and in controlling the fabrication processes of the semiconductor device.

The characteristics of the semiconductor device that can be evaluated by the evaluation portions of this embodiment include variations in off-leak characteristics and in the threshold voltage and on-state current, e.g., of MIS transistors.

In this embodiment as in the first embodiment, local variations in characteristics of the MIS transistors are counteracted, such that it is possible to accurately perform for example characteristics simulation, design, and fabrication process control based on variations in the characteristics which are substantially equal to variations in commercial semiconductor devices.

Figure 10:
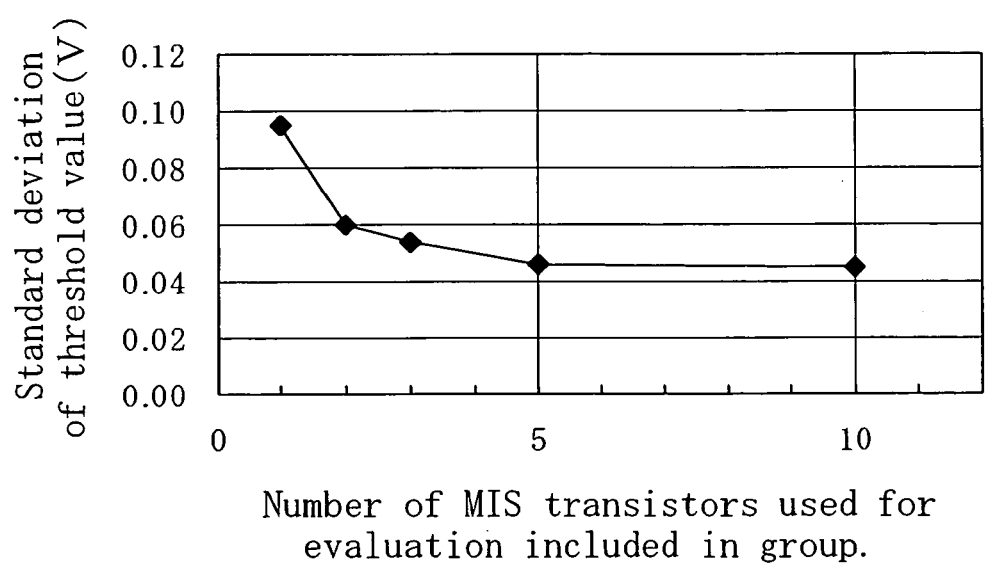
FIG. 10 is a graph indicating effects produced in the sixth and seventh embodiments.

FIG. 10 is a graph indicating effects produced in the sixth and seventh embodiments. In FIG. 10, the abscissa represents the number of MIS transistors used for evaluation in the groups (blocks and regions), while the ordinate indicates the standard deviation of the threshold values (threshold voltages) of the MIS transistors used for evaluation. The standard deviation is obtained by calculating the average value of the threshold values of the MIS transistors in the entire wafer by using the average values of the MIS transistors used for evaluation calculated for the respective groups. As shown in FIG. 10, it is found that as the number of MIS transistors used for evaluation within the groups are increased, the standard deviation of the threshold values is decreased. In other words, it can be found that if the average value and variance (standard deviation) of the characteristics of the MIS transistors used for evaluation in the entire wafer are calculated by using an evaluation portion in which a single MIS transistor used for evaluation is disposed, the results would be greater than variations of the value of the characteristics of an actually used MIS transistor in the semiconductor device that will serve as a product. It is therefore found that the reliability of evaluating the characteristics of the semiconductor device is increased in the sixth and seventh embodiments.

What is claimed is:

1. A semiconductor device comprising:
   a semiconductor substrate;
   at least one actually used MIS transistor disposed in an active region within the semiconductor substrate;
   a plurality of MIS transistors used for evaluation which are disposed in active regions within the semiconductor substrate, include respective gate electrodes, respective source regions, and respective drain regions, and are used to typify characteristics of the actually used MIS transistor;

a gate common conductive portion electrically connected to the respective gate electrodes of the MIS transistors used for evaluation;

a source common conductive portion electrically connected to the respective source regions of the MIS transistors used for evaluation; and a drain common conductive portion electrically connected to the respective drain regions of the MIS transistors used for evaluation.

2. The device of claim 1, wherein the MIS transistors used for evaluation are disposed in the active regions which are adjacent to each other.

3. The device of claim 2, wherein the respective gate electrodes of the MIS transistors used for evaluation are a single, commonized gate electrode.

4. The device of claim 3, further comprising:

an interlayer dielectric film interposed in between where the source and drain common conductive portions are and where the source and drain regions of the MIS transistors used for evaluation are; and plugs passing though the interlayer dielectric film to establish connection between the source common conductive portion and the source regions and between the drain common conductive portion and the drain regions, wherein the source and drain common conductive portions have branched head portions that are connected to the plugs.

5. The device of claim 3 or 4, further comprising dummy electrodes which are formed to both sides of the gate electrode of the MIS transistors used for evaluation, are arranged substantially in parallel with the gate electrode, and do not function as gates.

6. The device of claim 2, wherein the active regions, in which the MIS transistors used for evaluation are disposed, are arranged substantially in a row, and dummy active regions, in which no MIS transistors are present, are formed respectively alongside two of the active regions, the two regions being the endmost of the active regions.

7. The device of claim 1, wherein the MIS transistors used for evaluation have substantially the same structure as that of the actually used MIS transistor.

8. The device of claim 7, wherein the actually used MIS transistors are grouped into a plurality of types of actually used MIS transistors having substantially different structures; and the MIS transistors used for evaluation are grouped into a plurality of types of MIS transistors used for evaluation that are substantially the same in structure as the plurality of types of actually used MIS transistors.

9. The device of claim 1, wherein the active regions in which the MIS transistors used for evaluation are disposed have a larger dimension in the gate-length direction than that of the active region in which the actually used MIS transistor is disposed.

10. The device of claim 6, wherein the active regions, in which the MIS transistors used for evaluation are disposed, and the dummy active regions have a larger dimension in the gate-length direction than that of the active region in which the actually used MIS transistor is disposed.

11. A method for evaluating characteristics of a semiconductor device which includes a semiconductor substrate and an actually used MIS transistor disposed in an active region within the semiconductor substrate, the method comprising the steps of:

(a) dividing a wafer into a plurality of blocks each including a plurality of MIS transistors used for evaluation, evaluating characteristics of the MIS transistors used for evaluation for each said block, and storing evaluation results in a memory; and (b) calculating, for each said block, an average value of the characteristics of the MIS transistors used for evaluation from the evaluation results stored in the memory in the step (a), and storing calculation results in the memory.

12. The method of claim 11, wherein the wafer includes a gate common conductive portion electrically connected to respective gate electrodes of the MIS transistors used for evaluation, a source common conductive portion electrically connected to respective source regions of the MIS transistors used for evaluation, and a drain common conductive portion electrically connected to respective drain regions of the MIS transistors used for evaluation, and in the step (b), the average value of the characteristics of the MIS transistors used for evaluation that are connected to the gate common conductive portion, the source common conductive portion and the drain common conductive portion is calculated.

13. The method of claim 11, wherein in the step (a), the MIS transistors used for evaluation are disposed in scribe areas of the wafer.

* * * * *